United States Patent [19]

Leupold

[11] Patent Number: 5,216,400
[45] Date of Patent: Jun. 1, 1993

[54] MAGNETIC FIELD SOURCES FOR PRODUCING HIGH-INTENSITY VARIABLE FIELDS

[75] Inventor: Herbert A. Leupold, Eatontown, N.J.

[73] Assignee: The United States of America as represented by the Secretary of the Army, Washington, D.C.

[21] Appl. No.: 892,091

[22] Filed: Jun. 2, 1992

[51] Int. Cl.$^5$ .............................................. H01F 7/02
[52] U.S. Cl. .................................................. 335/306
[58] Field of Search ............................. 335/296–306, 335/210; 315/5.34, 5.35

[56] References Cited

U.S. PATENT DOCUMENTS

| 4,692,732 | 9/1987 | Leupold et al. | 335/302 |
| 4,701,737 | 10/1987 | Leupold | 335/301 |
| 4,837,542 | 6/1989 | Leupold | 335/306 |
| 4,839,059 | 6/1989 | Leupold | 201/335 |

OTHER PUBLICATIONS

Leupold et al., *Novel High-Field Permanent-Magnet Flux Sources*, IEEE Transactions on Magnetics, vol. MAG-23, No. 5, Sep. 1987, pp. 3628–3629.
Leupold et al., *A Catalogue of Novel Permanent-Magnet Field Sources*, Paper No. W3.2, 9th International Workshop on Rare-Earth Magnets and Their Applications, 1987, Bad Soden, Frg.
Leupold et al., "Applications of yokeless flux confinement," *Journal of Applied Physics*, 64(10), Nov. 15, 1988, pp. 5994–5996.
Abele et al., "A general method for flux confinement in permanent-magnet structures," *Journal of Applied Physics*, 64(10), Nov. 15, 1988, pp. 5988–5990.
Leupold, U.S. Statutory Invention Registration H591, entitled "Method of Manufacturing of a Magic Ring;".
Leupold et al., "Design applications of magnetic mirrors," *Journal of Applied Physics*, 63(8), Apr. 15, 1988, pp. 3987–3988.

Primary Examiner—Leo P. Picard
Assistant Examiner—Raymond Barr
Attorney, Agent, or Firm—Michael Zelenka; William H. Anderson

[57] ABSTRACT

A permanent magnet having a shell of magnetic material and a hollow cavity. The shell is permanently magnetized to produce an axially tapered magnetic field in the cavity. In one embodiment, a segmented spherical magnetic shell has a concentric spherical cavity. An access port in the form of an axial hole passes through polar segments of the shell along its polar axis P. The shell ("magic sphere") is magnetized such that it is capable of producing a tapered magnetic field in the cavity. Both the magnitude and direction of the remanence $B_R$ of the shell material vary from segment to segment. Another embodiment shows a segmented cylindrical shell in the form of a ("magic ring"). The shell material has a magnetic remanence $B_R$ that varies in magnitude and direction from segment to segment. The shell produces a axially tapered field in the cavity.

6 Claims, 3 Drawing Sheets

MAGNETIC FIELD SOURCES FOR PRODUCING HIGH-INTENSITY VARIABLE FIELDS

GOVERNMENT INTEREST

The invention described herein may be manufactured, used, and licensed by or for the Government for governmental purposes without the payment to me of any royalty thereon.

BACKGROUND OF THE INVENTION

1. Field of the Invention

The present invention relates to high-intensity permanent magnets. More specifically, it relates to magnets having a high-intensity working magnetic field that varies in the direction of its orientation.

2. Description of the Prior Art

There are a number of technological fields in which magnetic systems capable of producing large magnetic fields with axial gradients are desirable. For example, electron-beam tubes often require gradient fields for beam focusing and guidance. Such gradient fields typically vary along the beam axis. As another example, an axial field variation of a longitudinal field is required in many micro/millimeter wave sources. In applications where transverse fields are required, as in storage rings and particle accelerators, field tapering in the direction of the beam axis is sometimes necessary to compensate for changes in the axial beam velocity. Still further, in the fields of chemical analysis and spectroscopy, magnetic fields with a linear taper in the field direction are often used to produce a spectral distribution of absorbed or emitted electromagnetic energy.

Those concerned with the development of such systems have long recognized the need for magnetic structures capable of producing gradient magnetic fields of high intensity in a compact structure, i.e. a magnet having a minimum of structural mass and bulk. The present invention fulfills this need.

High-remanence, high-coercivity, permanent-magnet materials, such as those of the rare-earth type, have improved so that it is now practical to make flux sources of extraordinary strength and compaction. Examples of high-intensity, compact permanent magnets may be found in the following references:

Leupold, U.S. Pat. No. 4,837,542, entitled "Hollow Substantially Hemispherical Permanent Magnet High-Field Flux Source for Producing a Uniform High Field;"

Leupold, U.S. Pat. No. 4,839,059, entitled "Clad Magic Ring Wigglers;"

Leupold et al., "Novel High-Field Permanent-Magnet Flux Sources," *IEEE Transactions on Magnetics*, vol. MAG-23, No. 5, pp. 3628-3629, Sep. 1987;

Leupold et al., "A Catalogue of Novel Permanent-Magnet Field Sources," *Paper No. W3.2, 9th International Workshop on Rare-Earth Magnets and Their Applications*, pp 109-123, Aug. 1987, Bad Soden, FRG;

Leupold et al., "Design applications of magnetic mirrors," *Journal of Applied Physics*, 63(8), 15 Apr. 1988, pp. 3987-3988;

Leupold et al., "Applications of yokeless flux confinement," *Journal of Applied Physics*, 64(10), Nov. 15, 1988, pp. 5994-5996; and Abele et al., "A general method for flux confinement in permanent-magnet structures," *Journal of Applied Physics*, 64(10), Nov. 15, 1988, pp. 5988-5990.

Additionally, magnets of the type described herein may be found in my following copending U.S. Patent Applications that are incorporated herein by reference:

U.S. Ser. No. 654,476, filed Feb. 13, 1991, entitled "High-Power Electrical Machinery;"

U.S. Ser. No. 650,845, filed Feb. 5, 1991, entitled "High-Power Electrical Machinery with Toroidal Permanent Magnets;"

U.S. Ser. No. 709,548, filed Jun. 3, 1991, entitled "High-Field Permanent Magnet Flux Source;"

U.S. Ser. No. 892,104, filed Jun. 2, 1992, entitled "Magnetic Field Sources Having Non-Distorting Access Ports," and U.S. Ser No. 892,093, filed Jun. 2, 1992, entitled "Field Augmentation in High-Intensity Magnetic Field Sources'".

These references show a number of high-intensity permanent magnets having a variety of different compact shapes. In general, these magnets have a shell of magnetic material and a cavity in which a uniform working field is located. Access ports of various sizes, shapes and locations pass through the shell and communicate with the uniform field in the cavity.

Salient among these magnets are cylindrical ("magic ring") and spherical ("magic sphere") magnetic shells in which the direction of remanent magnetization in the shell changes as a function of a polar angle while its intensity remains constant. These magnets produce in their cavities uniform, polar-axial transverse fields. Theoretically, there is no limit to the cavity fields attainable in a magnet of this type if one is willing to employ enough magnetic material of sufficiently high coercivity to retain its magnetism in the face of the high distorting fields engendered by the structure.

In practice, it is difficult to produce a spherical or cylindrical shell having a remanent magnetization the direction of which continuously varies. Consequently, such shells are typically constructed from segments that are each uniformly magnetized. When nested, the segments form a magnetic shell. In the case of a segmented cylindrical shell, the angular direction of magnetization usually changes abruptly by $4\pi/N$ between adjacent segments, where N is the number of nested segments.

A working field produced by a segmented shell suffers surprisingly little from the approximation by segmentation. For example, if a cylindrically shaped shell is divided into sixteen segments, it produces a magnetic field of over 97% of that produced by a continuous structure. Even with a coarse approximation of only eight segments, 90% of the ideal field is realized. Specifically, a segmented spherical shell having an outer radius of 3.3 centimeters (cm) that is made of a magnetic material having a remanence of ten kilogauss (kG) can produce a field of sixteen kilo-oerstead (kOe) in a spherical cavity having a radius of only 1.0 cm. The shell would have a mass of only 1.1 kilograms. Similar performance is obtainable from cylindrical and hemispherical structures.

Although such compact magnets have served to produce high-intensity magnetic fields, it is recognized that such fields are normally of substantial uniformity. As indicated above, an important need also exists for compact magnets that produce variable fields of comparable intensity.

SUMMARY OF THE INVENTION

The general purpose of this invention is to provide a compact permanent-magnet flux source having a working field of very high intensity that varies in the direction of its orientation. To attain this, the present invention contemplates a unique magnet in which the remanent magnetization of a magnetic structure varies such that there is a predetermined field variation in a working space.

More specifically, the present invention includes a permanent magnet having a shell of magnetic material and a hollow cavity. The shell is permanently magnetized to produce an axially tapered magnetic field in the cavity.

In one embodiment, a segmented spherical magnetic shell has a concentric spherical cavity. An access port in the form of an axial hole passes through polar segments of the shell along its polar axis P. The shell ("magic sphere") is magnetized such that it is capable of producing a tapered magnetic field in the cavity. Both the magnitude and direction of the remanence $B_R$ of the shell material vary from segment to segment.

Another embodiment shows a segmented cylindrical shell in the form of a "magic ring." The shell material has a magnetic remanence $B_R$ that varies in magnitude and direction from segment to segment. The shell produces an axially tapered field in the cavity.

The exact nature of this invention, as well as other objects and advantages thereof, will be readily apparent from consideration of the following specification relating to the annexed drawing.

DETAILED DESCRIPTION OF THE PREFERRED EMBODIMENTS

Figure 1:
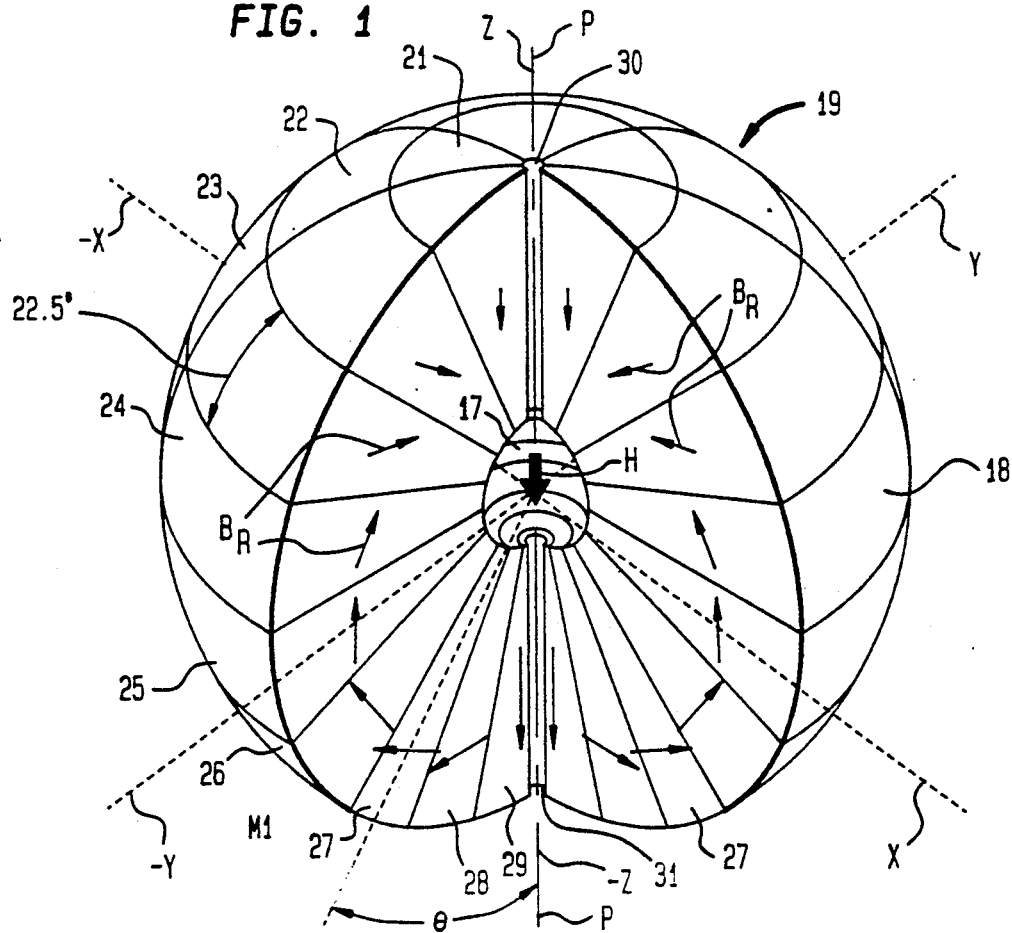
FIG. 1 is a pictorial view of a preferred embodiment of the invention showing a "magic-sphere" type magnet with a 90° section removed.

Referring now to the drawings, there is shown in FIG. 1 a high-field permanent magnet 19 having a spherical magnetic shell 18, a concentric spherical cavity 17, and coaxial access ports 30, 31. Ports 30, 31 pass through shell 18 on opposite sides of cavity 17 along a polar axis P that is coincident with a vertical Z axis of X-Y-Z rectangular coordinates that have their center at the spherical center of shell 18.

Ports 30, 31 are coaxial, narrow, cylindrical holes of sufficient size to permit access to working field H which is located in cavity 17. Utilization of working field H is typically established via its interaction with light in an optical fiber, an electron beam, energy in a waveguide, etc.

Magnetic shell 18 is SHAPED as a conventional segmented "magic-sphere" type magnet. Shell 18 comprises a series of nine nested cones 21-29 of equal angular extent, i.e. each cone subtends an angle of 22.5° as is illustrated by a double-headed arrow on cone 23. Nested cones 21-29 are centered about vertical polar axis P (rectangular axis Z) and intersect at the spherical center. Considering cone 23, by way of example, it is readily seen to be a shell having inner and outer spherical surfaces and nesting conical surfaces that are spaced by 22.5° and intersect at the spherical center.

While nine cones are depicted in FIG. 1, magnet 19 might comprise a fewer or larger number. Of course, the larger the number of cones, the closer magnet 19 approximates an ideal magnet of the type where the magnetization changes continuously. It is noted that shell 18 is composed of seventy-two segments. For clarity, a 90° portion composed of eighteen segments is omitted in FIG. 1.

Cones 21-29 are segmented along equally spaced meridians. It can be seen that cones 21-29 are each comprised of eight similar segments (two segments of each cone are not shown). Although cones 21-29 are illustrated as being segmented into eight segments each, they may comprise a fewer or greater number of segments: the greater the number of segments, the closer shell 18 will approximate an ideal configuration.

The remanence $B_R$ in each of the segments of cones 21-29 is uniform, i.e. constant in magnitude and direction. However, the remanence $B_R$ from cone to cone varies in both magnitude and direction with the average polar angle $\theta$ of its cone (the average polar angle $\theta$ for cone 27 is shown in FIG. 1). As can be seen in FIG. 1, both the intensity (length of arrows $B_R$) and the direction of remanence $B_R$ vary from cone to cone.

More specifically, the orientation of remanence $B_R$ in terms of its polar angle $\gamma$ varies as a function of the average polar angle $\theta$ of the cone in question in accordance with equation (1) as follows:

$$\gamma = 2\theta \qquad (1)$$

Figure 2:
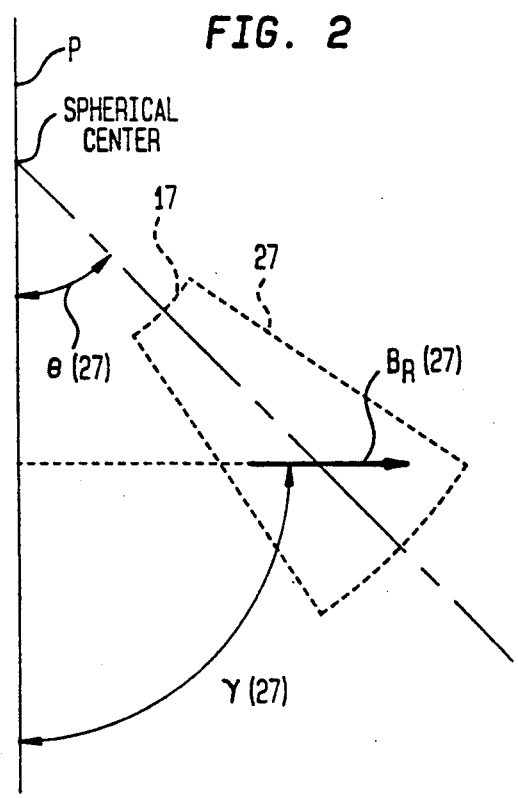
FIG. 2 is a schematic polar diagram illustrating angular relationships of portions of the device shown in FIG. 1.
Figure 3:
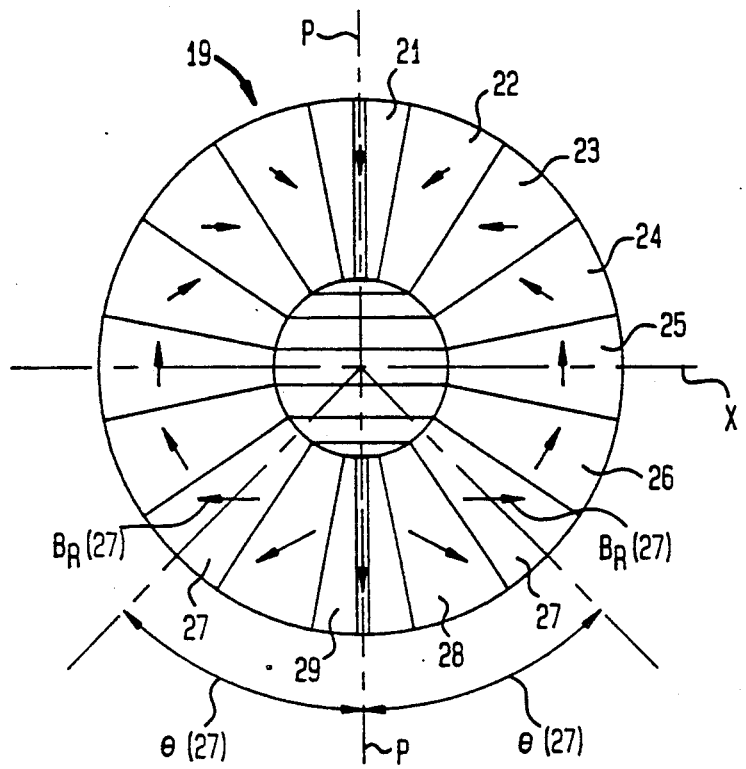
FIG. 3 is a sectional elevation view of the device shown in FIG. 1.

FIGS. 2 and 3 illustrate the magnetization orientation for a segment from cone 27. In FIG. 2, the average polar angle for cone 27 is designated $\theta(27)$, the remanence for the material of cone 27 is designated $B_R(27)$, and the remanence orientation in cone 27 is designated $\gamma(27)$. It is noted that $\theta(27)$ is 45° and $\gamma(27)$ is 90°.

As is well known in the art, if the magnitude of the remanence $B_R$ was constant throughout shell 18, magnet 19 would produce a magnetic field of substantial uniformity in cavity 17. The field would be directed downwardly and parallel to the polar axis P as viewed in FIG. 1. In the present invention, however, working field H has a gradient (axial field taper) in the direction of field orientation. The axial gradient of field H is achieved by varying the magnitude of the remanent magnetization. To obtain a linear field taper, remanence $B_R$ is varied as a function of polar angle $\theta$ in accordance with equation (2) as follows:

$$B_R(\theta) = [B_R(\text{MAX}) - B_R(\text{MIN})]\frac{\theta}{\pi} + B_R(\text{MIN}) \qquad (2)$$

where: $B_R(\theta)$ is the magnet remanence for the segments;
 $B_R(\text{MAX})$ is the maximum remanence (usually the highest remanence available among the suitable materials);
 $B_R(\text{MIN})$ is the remanence appropriate to produce a field H(MIN) at the low end of the taper (see equation 3); and
 $\theta$ is the average polar angle for the segment.

The relationship between the magnitudes of minimum remanence $B_R(\text{MIN})$ and minimum field H(MIN) for the "magic-sphere" type magnet of FIG. 1 is given by equation (3) as follows:

$$B_R(\text{MIN}) = \frac{3}{4} \frac{H(\text{MIN})}{\ln(r_o/r_i)} \quad (3)$$

where:
$r_o$ is the outer radius of shell 18; and
$r_i$ is the inner radius of shell 18.

For a working field H that varies linearly along polar axis P such that it is twice as great at one end of cavity 17 as it is at the other end, magnetic remanence $B_R$ varies as a function of average polar angle $\theta$ in accordance with equations (4)–(6) as follows:

$$B_R(\theta) = \frac{B_R(\text{MAX})}{2}\left(1 - \frac{\theta}{\pi}\right) + \frac{B_R(\text{MAX})}{2} \quad (4)$$

$$B_R(\theta) = B_R(\text{MAX}) - \frac{B_R(\text{MAX})}{2\pi}\theta \quad (5)$$

$$B_R(\theta) = B_R(\text{MAX})\left(1 - \frac{\theta}{2\pi}\right) \quad (6)$$

In this case, working magnetic field H on polar axis P is a maximum, H(MAX), adjacent port 31 and is twice the minimum field H(MIN), which is located adjacent port 30. (In this example, H(MAX)=2H(MIN)).

The magnitude of field H(MAX) is dictated by $B_R(\text{MAX})$, which is the remanence of the material used in polar cone 29. The magnitude of the minimum remanence $B_R(\text{MIN})$ is determined by the desired size of the field at the low end of the taper, i.e minimum field H(MIN). The material used to fabricate polar cone 21 has a remanence of $B_R(\text{MIN})$.

For the general case, equation (2) is used to determine the remanence $B_R$ for the non-polar cones 22–28. With regard to the special case in which H(MAX)=2H(MIN), the remanence of non- fabrication of magnetic materials having a variety of different remanence values is a routine task for those skilled in these arts.

Figure 4:
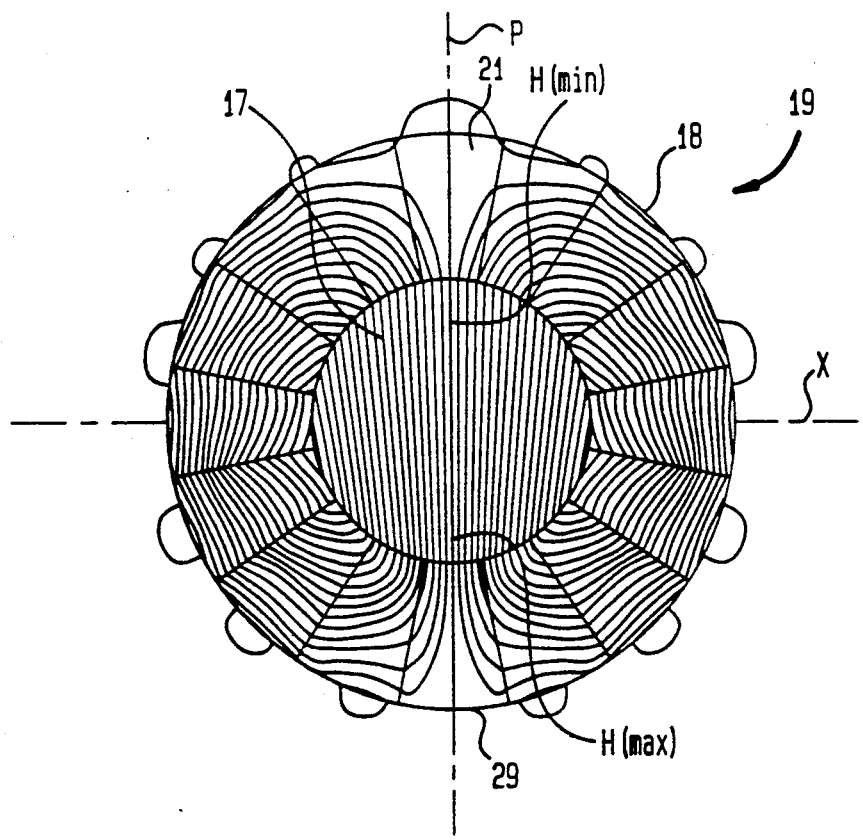
FIG. 4 is a sectional elevation view illustrating magnetic flux lines for the device shown in FIG. 1.

FIG. 4 illustrates the flux lines for magnet 19 of FIG. 1 with a linear axial taper. As can be seen in FIG. 4, the flux lines for the working field are closer together at the bottom of cavity 17 near cone 29, indicating a larger field H(MAX). These flux lines spread linearly as they extend upwardly in cavity 17 toward cone 21, indicating a linear taper. At the uppermost region of cavity 17, the flux lines are furthest apart, indicating the smaller field H(MIN).

Figure 5:
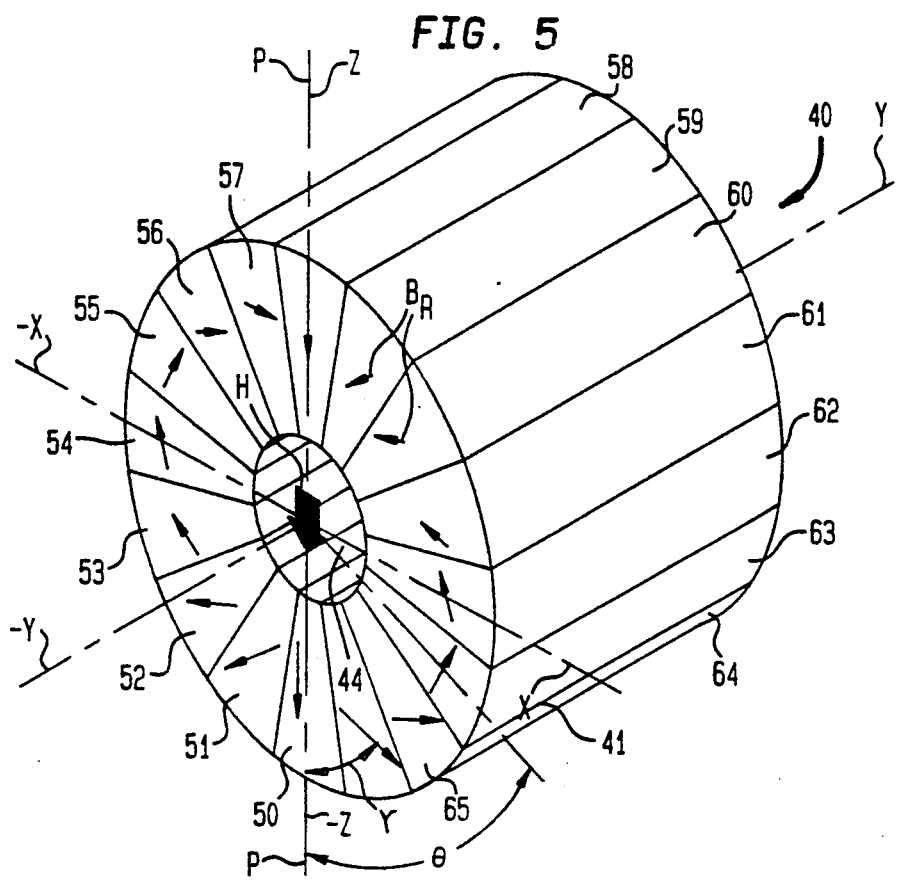
FIG. 5 is a pictorial view of another embodiment of the invention showing a "magic-ring" type magnet.

FIG. 5 illustrates a segmented, cylindrical magnet 40 shaped as a "magic ring." Magnet 40 has a plurality of similar segments 50–65 that are nested to form a cylindrical shell 41 with a concentric cylindrical cavity 44. Access to cavity 44 may be by way of access ports (not shown) that pass through one or more of segments 50–65 or by way of the open ends of shell 41.

Figure 6:
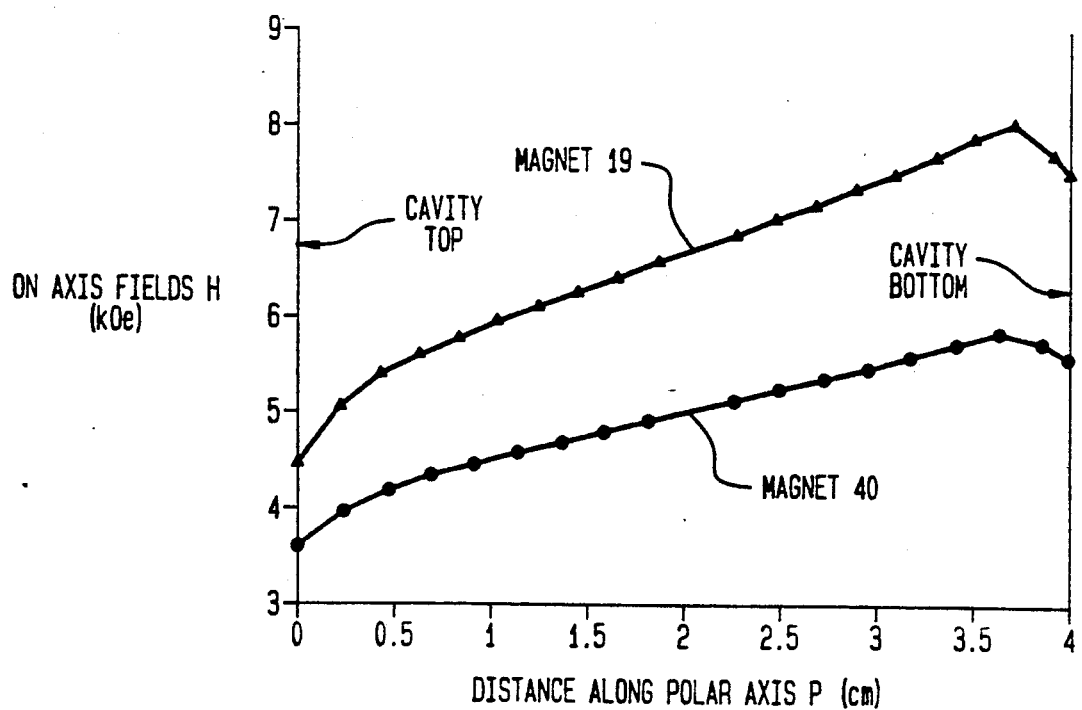
FIG. 6 is a graph showing results achieved for magnets made in accordance with the preferred embodiments of FIGS. 1 and 5.

The segments 50–65 are all similarly shaped. Also, each segment 50–65 is uniformly magnetized in a plane perpendicular to the cylindrical axis Y of magnet 40. From segment to segment, the orientation of remanence $B_R$ varies with and twice that of average polar angle $\theta$ (or azimuthal angle) as seen in FIG. 6, where the cylindrical axis Y is the pole, and the polar axis P lies in a polar plane defined by the Y-Z axes. The polar plane passes through the center of polar segments 50, 58. Also, as can be seen in FIG. 5, both the intensity (length of arrows $B_R$) and the direction of remanence $B_R$ vary from segment to segment.

More specifically, the orientation of remanence $B_R$ in terms of its polar angle $\gamma$, which is measured in the X-Z plane, varies as a function of the average polar angle $\theta$ in accordance with equation (7) as follows:

$$\gamma = 2\theta \quad (7)$$

It is noted that equations (1) and (7) are similar. In equation (7), however, polar angles $\theta$ and $\gamma$ are measured in the X-Z plane.

As is well known in the art, if the magnitude of the remanence $B_R$ is constant throughout shell 41, magnet 40 will produce a magnetic field of substantial uniformity in cavity 44. The field direction is down and parallel to polar axis P as viewed in FIG. 5.

In the present invention, however, a working field H having a linear gradient (axial field taper) is generated in cavity 44. The linear gradient in the field direction is achieved by varying the magnitude of the remanent magnetization. For example, a working field H that lies in the polar plane Y-Z and varies linearly in the field direction, which is parallel to polar axis P, is achieved in magnet 40 by varying magnetic remanence $B_R$ as a function of average polar angle $\theta$ in accordance with equation (8) as follows:

$$B_R(\theta) = [B_R(\text{MAX}) - R_R(\text{MIN})]\frac{\theta}{\pi} + B_R(\text{MIN}) \quad (8)$$

where:
$B_R(\theta)$ is the magnet remanence for the segments 50–65;
$B_R(\text{MIN})$ is the minimum remanence appropriate to produce a field H(MIN) at the low end of the taper (see equation (9));
$B_R(\text{MAX})$ is the maximum remanence (usually the highest remanence available among the suitable materials); and
$\theta$ is the average polar angle in the X-Z plane for the segment.

The magnitude of field H(MAX) is determined by the value of $B_R(\text{MAX})$, i.e. the remanence in segment 50. The intensity of the minimum remanence $B_R(\text{MIN})$, i.e. the remanence in segment 58, is determined by the desired size of the field at the end of the taper, i.e minimum field H(MIN).

The relationship between the magnitude of remanence $B_R$ and axially tapered magnetic field H for the "magic-ring" type magnet 40 of FIG. 5 is given by equation (9) as follows:

$$B_R(\text{MIN}) = \frac{H(\text{MIN})}{\ln(r_o/r_i)} \quad (9)$$

where:
$r_o$ and $r_i$ are respectively the outer and inner radii of shell 41; and
H(MIN) is the magnitude of the minimum working field in cavity 44.

The distribution of the flux lines for the cylindrical magnet 40 will be similar to those illustrated in FIG. 4, which illustrates flux lines for magnet 19 of FIG. 1. In the case of the spherical magnet 19, the flux lines of FIG. 4 are symmetrical about the polar axis P. In the case of the cylindrical magnet 40, the flux lines of FIG. 4 are symmetrical about the polar plane X-Z.

FIG. 6 graphically depicts linear variations in the magnitude of axial working fields H for magnets 19 and 40 in which the cavities 17 and 44 have equal radii. The variations are plotted as a function of axial distance on polar axis P, with the zero distance located at the top of cavities 17 and 44. Here, both the field and slope are greater for the spherical case when compared to the cylindrical case. Over the central 65% of the axis there are near perfect linear slopes in both cases.

Obviously many other modifications and variations of the present invention are possible in the light of the above teachings. For example, the inventive technique may be readily applied to a variety of other magnetic flux sources. Those skilled in the art will find it obvious in the light of the above teachings, to employ this technique when designing toroidal magnets or hemispherical magnets. Further, this technique may be readily applied to magnetic structures of other than spherical or cylindrical shape. It is therefore to be understood, that within the scope of the appended claims, the invention may be practiced otherwise than as specifically described.

What is claimed is:

1. A permanent magnet comprising:
a spherical shell of magnetic material having a spherical hollow cavity positioned concentrically within said shell and having a polar axis that passes through a center of the shell and cavity, said shell being permanently magnetized to produce a gradient magnetic field in said cavity, wherein the magnetic material has a remanence that varies in direction and magnitude such that the angular orientation of the remanence in terms of a polar angle $\gamma$ is related to an average polar angle $\theta$ of the material's average location in accordance with the equation $\gamma = 2\theta$, and wherein said magnetic field has a linear field taper.

2. The magnet of claim 1 wherein said remanence, $B_R(\theta)$, varies from a maximum value, $B_R(MAX)$, to a minimum value, $B_R(MIN)$, as a function of said polar angle $\theta$ as follows:

$$B_R(\theta) = [B_R(MAX) - R_R(MIN)]\frac{\theta}{\pi} + B_R(MIN).$$

3. The magnet of claim 2 wherein said shell comprises a plurality of magnetic segments and wherein each said segment is uniformly magnetized.

4. A permanent magnet comprising:
a cylindrical shell of magnetic material having a cylindrical hollow cavity positioned concentrically within said shell, said shell and said cavity having a similar cylindrical axis and having a polar axis that passes through said cylindrical axis, said shell having ana access port being aligned with said polar axis, said shell being permanently magnetized to produce a transverse gradient magnetic field in said cavity, wherein the magnetic material has a remanence that varies in direction and magnitude such that the angular orientation of the remanence in terms of a polar angle $\gamma$ is related to an average polar angle $\theta$ of the material's average location in accordance with the equation $\gamma = 2\theta$, and wherein said magnetic field has a linear field taper.

5. The magnet of claim 4 wherein said remanence, $B_R(\theta)$, varies from a maximum value, $B_R(MAX)$, to a minimum value, $B_R(MIN)$, as a function of said polar angle $\theta$ as follows:

$$B_R(\theta) = [B_R(MAX) - R_R(MIN)]\frac{\theta}{\pi} + B_R(MIN).$$

6. The magnet of claim 5 wherein said shell comprises a plurality of magnetic segments and wherein each said segment is uniformly magnetized.

* * * * *